United States Patent
Zang et al.

(10) Patent No.: US 12,284,839 B2
(45) Date of Patent: Apr. 22, 2025

(54) DUAL DEPTH JUNCTION STRUCTURES AND PROCESS METHODS

(71) Applicant: OMNIVISION TECHNOLOGIES, INC., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 475 days.

(21) Appl. No.: 17/700,858

(22) Filed: Mar. 22, 2022

(65) Prior Publication Data

US 2023/0307474 A1   Sep. 28, 2023

(51) Int. Cl.
| | | |
|---|---|---|
| *H01L 31/062* | (2012.01) | |
| *H01L 31/113* | (2006.01) | |
| *H10F 39/00* | (2025.01) | |
| *H10F 39/18* | (2025.01) | |

(52) U.S. Cl.
CPC ..... *H10F 39/80373* (2025.01); *H10F 39/014* (2025.01); *H10F 39/18* (2025.01)

(58) Field of Classification Search
CPC ......... H01L 27/14614; H01L 27/14643; H01L 27/14689; H01L 27/14612; H01L 29/41766
USPC ........................................................ 257/292
See application file for complete search history.

(56) References Cited

U.S. PATENT DOCUMENTS

| | | | |
|---|---|---|---|
| 2012/0242875 A1* | 9/2012 | Nakamura | H01L 27/1461 438/57 |
| 2014/0159142 A1* | 6/2014 | Lim | H01L 29/7834 438/270 |

* cited by examiner

*Primary Examiner* — Theresa T Doan
(74) *Attorney, Agent, or Firm* — Christensen O'Connor Johnson Kindness PLLC

(57) ABSTRACT

Transistors, electronic devices, and methods are provided. Transistors include a gate trench formed in a semiconductor substrate and extending to a gate trench depth, and a source and a drain formed as doped regions in the semiconductor substrate and having a first conductive type. The source and the drain are formed along a channel length direction of the transistor at a first end and a second end of the gate trench, respectively, and the source and the drain each includes a first doped region and a second doped region extending away from the first doped region. The second doped region extends to a depth in the semiconductor substrate deeper than the first doped region relative to a surface of the semiconductor substrate.

22 Claims, 9 Drawing Sheets

DUAL DEPTH JUNCTION STRUCTURES AND PROCESS METHODS

BACKGROUND

This disclosure relates generally to image sensors, and in particular but not exclusively, transistors for image sensors.

Image sensors are ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

Increasing channel width is one manner to improve transistor performance in image sensors. Non-planar (3D) gate structures are one manner of achieving greater effective channel width. In such transistors, the channel performance depends in part on the depth of the source and drain junctions in the semiconductor substrate. Deeper junctions improve charge carrier mobility through the channel, but may also cause current leakage, particularly from adjacent transistors. Thus, a need exists for improved transistors.

BRIEF DESCRIPTION OF THE SEVERAL VIEWS OF THE DRAWINGS

Non-limiting and non-exhaustive embodiments of the present disclosure are described with reference to the following figures, wherein like reference numerals refer to like parts throughout the various views unless otherwise specified.

DETAILED DESCRIPTION

Figure 1:
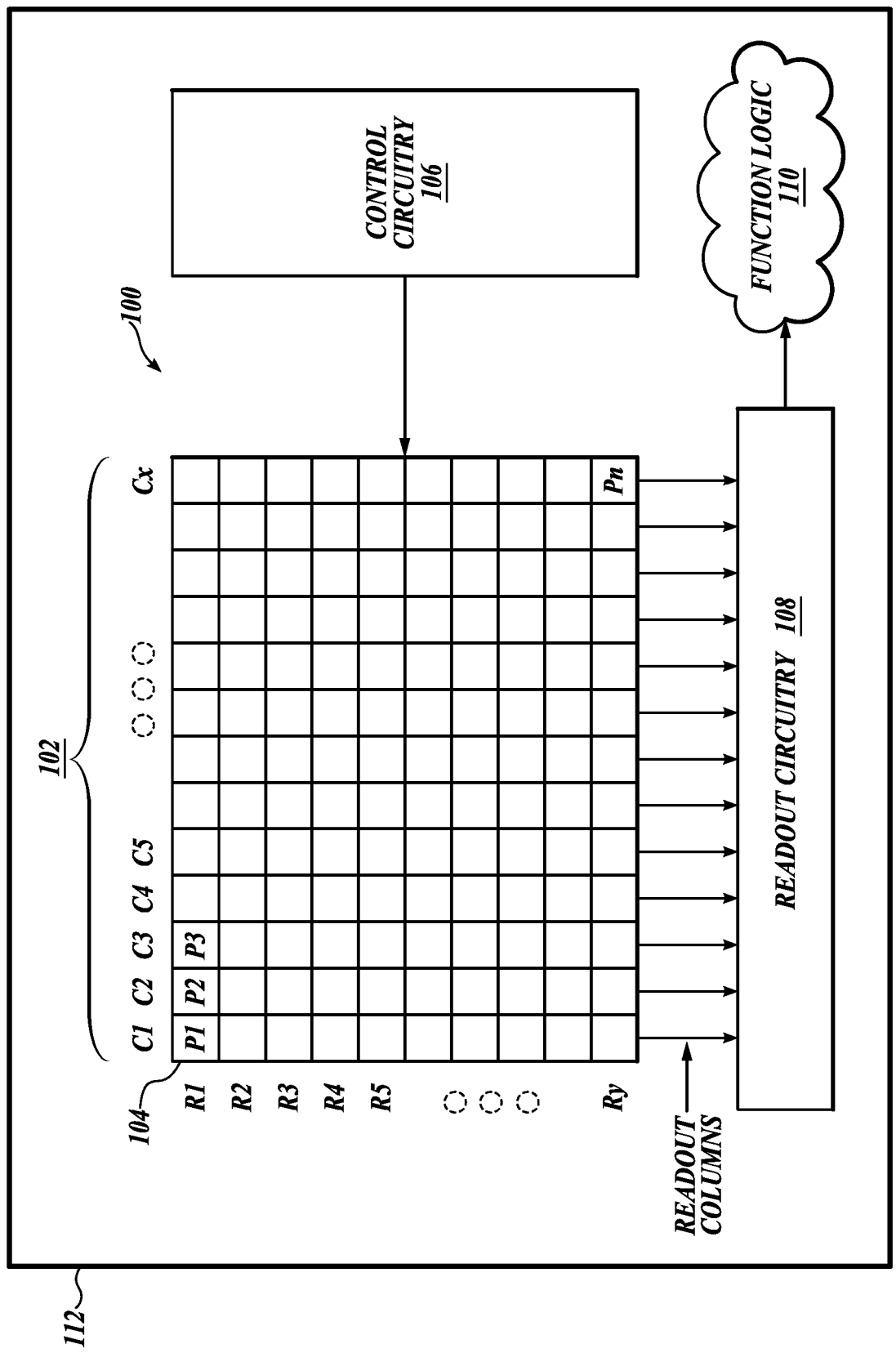
FIG. 1 is a block diagram illustrating an embodiment of an image sensor in accordance with the teachings of the present disclosure.

The present disclosure provides transistors, pixels, image sensors, electronic devices, and methods for manufacturing the same. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "In some embodiments" or "in an embodiment" or "in any embodiment," in various places throughout this specification are not necessarily all referring to the same example. Furthermore, any particular features, structures, and/or characteristics of any embodiments may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The present disclosure also provides transistors for image sensors, for example source follower transistors, reset transistors, and row select transistors. To facilitate understanding, the present disclosure describes such transistors in the context of complementary metal-oxide-semiconductor ("CMOS") image sensors. However, it shall be appreciated that the present disclosure shall not be limited to transistors for CMOS image sensors, but may be applied to non-CMOS image sensors and other transistor types as well. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

In the present disclosure, the terms "semiconductor substrate" or "substrate" refer to any type of substrate used for forming electronic devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

This disclosure refers to a number of terms with respect to different embodiments (including apparatuses and methods). Terms having alike names have alike meanings with respect to different embodiments, except where expressly noted. To clarify this, alike elements have alike numbering between figures and shall be understood to be capable of having any one or more features of the other alike elements except for the pertinent differences described. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The present application may also reference quantities and numbers. Unless specifically stated, such quantities and numbers are not to be considered restrictive, but representative of the possible quantities or numbers associated with the present application. Also, in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

FIG. 1 is a diagram illustrating one example of a representative image sensor 100 with a pixel array 102 of pixel 104. As shown, the pixel array 102 is coupled to a control circuitry 106 and to a readout circuitry 108, which is coupled to a function logic 110.

Pixel array 102 is a two-dimensional ("2D") array of pixels 104 (e.g., pixels P1, P2 . . . , Pn). In one embodiment, each pixel 104 is a complementary metal-oxide-semiconductor ("CMOS") imaging pixel. Pixel array 102 may be implemented as either a front side illuminated image sensor array or a backside illuminated image sensor array. In some embodiments, pixels 104 include one or more transistors as described below, including source follower transistors, row select transistors, and/or reset transistors. In embodiments, at least one of the transistors has at least one vertical gate structure. As illustrated, the pixels 104 are arranged into rows (e.g., rows R1 to Ry) and columns (e.g., column C1 to Cx) to acquire image data of a person, place, or object, which can then be used to render a 2D image of the person, place, or object.

After a pixel 104 has acquired its image data or image charge, the image data is readout by readout circuitry 108 and transferred to function logic 110. Readout circuitry 108 may include amplification circuitry, e.g., a differential amplifier circuitry, analog-to-digital ("ADC") conversion circuitry, or otherwise. In some embodiments, the readout circuitry 108 may readout a row of image data at a time along readout column lines (illustrated) or may readout the image data using a variety of other techniques (not illustrated), such as a serial readout or a full parallel readout of all pixels simultaneously.

Control circuitry 106 is coupled to pixels 104 of pixel array 102 and includes logic and memory for controlling operational characteristics of pixels 104. For example, control circuitry 106 may generate a shutter signal for controlling image acquisition. In some embodiments, the shutter signal is a global shutter signal for simultaneously enabling all pixels 104 to simultaneously capture their respective image data during a single acquisition window. In some embodiments, the shutter signal is a rolling shutter signal whereby each row, column, or group of pixels 104 is sequentially enabled during consecutive acquisition windows.

Function logic 110 includes logic and memory for storing the image data or even manipulating the image data by applying post image effects (e.g., crop, rotate, remove red eye, adjust brightness, adjust contrast, or otherwise).

In any embodiment, any one or more of image sensor 100, pixel array 102, or pixels 104 may be embodied in an electronic device 112, e.g., a smartphone, a camera, an endoscope, biometric sensing device, light-based proximity sensor, and the like.

Figure 2:
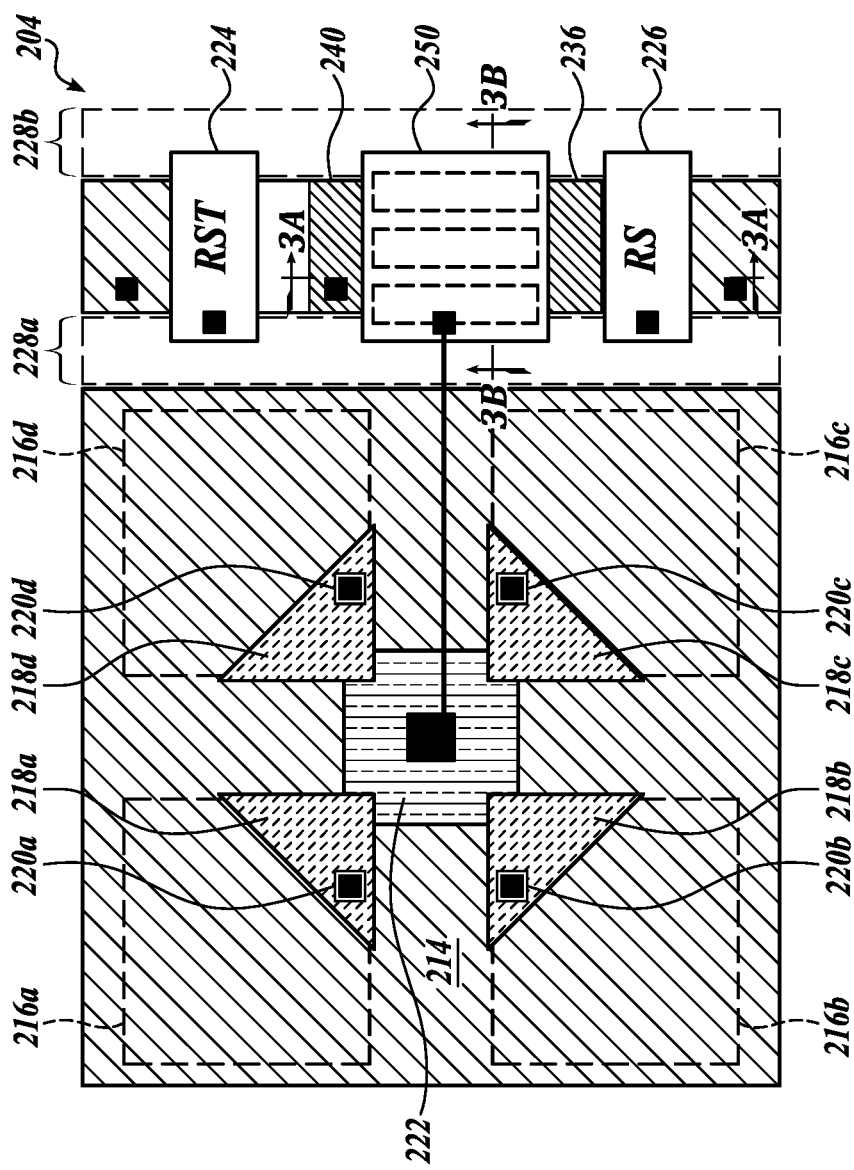
FIG. 2 shows an embodiment of a layout of a pixel in accordance with the teachings of the present disclosure.

FIG. 2 shows one representative example of a layout of a simplified pixel 204, which may be utilized in an image sensor such as the image sensor 100 of FIG. 1, which itself may be integrated into an electronic device such as a smart phone. The pixel layout shown in FIG. 2 is representative, and the teachings of the present disclosure may be embodied in many other pixel layouts.

The pixel 204 includes a semiconductor substrate 214 having a plurality of photodiodes 216a-d formed therein and arranged in a "four-shared" configuration. Transfer transistors 218a-d each may have a vertical transfer gate 220a-d that transfers charge from one of the corresponding photodiodes 216a-d to a floating diffusion 222 upon turning on e.g., receiving transfer signal. The floating diffusion 222 is coupled to a source follower transistor 250 (e.g., by a metal interconnect as illustrated in FIG. 2) and a reset transistor 224, and the source follower transistor 250 is coupled to a row select transistor 226.

Floating diffusion 222 is coupled to planar transfer gates of transfer transistors 218a-d and to a gate of source follower transistor 250, and operates to aggregate charge carriers from photodiodes 216a-d (via one or more transfer transistors 218a-d) and to output a corresponding voltage to the gate of source follower transistor 250 for signal amplification and read out.

Photodiodes 216a-d are each configured to generate and accumulate charges in response to incoming light received during an integration period of the image sensor. Charges, e.g., photoelectrons, accumulated in a charge accumulation region of photodiodes 216a-d (e.g., a source of transfer transistors 218a-d), for example during the integration period of an image sensor, can be selectively transferred to the floating diffusion 222 (e.g., drain of transfer transistors 218a-d) during the charge transfer period of the image sensor depending on voltage applied to the planar gate of transfer transistors 218a-d. In some embodiments, the photodiodes 216a-d have a pinned photodiode configuration.

Reset transistor 224 is configured to reset (e.g., discharge or charge) coupled photodiodes 216a-d via transfer transistors 218a-d and floating diffusion 222 to a preset voltage e.g., a supply voltage $V_{DD}$, under control of a reset signal received at the gate RST of reset transistor 224 during a reset period.

Source follower transistor 250 is coupled between a power line and the row select transistor 226, and modulates the image signal output based on the voltage outputted by floating diffusion 222, where the image signal corresponds to the amount of photoelectrons accumulated in charge accumulation region of coupled photodiodes 216a-d during the integration period at the gates thereof. The source follower transistor 250 amplifies the image signal based upon a voltage received at the gate thereof. The source follower transistor 250 and the reset transistor 224 may both couple to the same power line receiving the supply voltage $V_{DD}$. For example, a drain of the source follower transistor 250 and a drain of the reset transistor 224 are coupled to the supply voltage $V_{DD}$.

In this disclosure, the terms "channel width plane," "channel width direction," channel length plane," and "channel length direction," are used to describe features of transistors and pixels. For clarity, a "channel width plane" is a plane extending across a channel through which charge carriers flow between a source and a drain of a transistor (e.g., source 236 and drain 240 of source follower transistor 250). In other words, a channel width plane or channel width direction is perpendicular to the direction of current flow. By comparison, a channel length plane or channel length direction is oriented perpendicular to all channel width planes and parallel to the direction of current flow.

Row select transistor 226 selectively couples the output of the source follower transistor 250 (e.g., image signal) to the readout column line under control of a row select signal received at the gate RS thereof.

The region where source follower transistor 250, reset transistor 224, and row select transistor 226 are disposed can be referred to as a transistor region of the pixel 204. By comparison, the region where the photodiodes 216a-d, transfer transistors 218a-d, and floating diffusion 222 are disposed may be referred to as the active region. An isolation structure 228a (e.g., shallow channel isolation trench structures having a depth of about 150 nm to about 400 nm with respect to a front side of the semiconductor substrate 214) is disposed between the active region and the transistor region and extends along a channel length direction. In some embodiments, the isolation structures 228a-b form part of the inventive transistors described below. Some embodiments include a plurality of isolation structures 228a-b, i.e., one on each side of the transistor region.

In some embodiments, the pixel 204 may include additional elements that are not described in detail herein, such as one or more additional transistors, capacitors, floating diffusions, or the like. In some embodiments, the transfer gate of the transfer transistors 218a-d utilize a planar transfer gate without vertical transfer gates 220a-d.

In operation, during the integration period of the image sensor (also referred to as an exposure or accumulation period), photodiodes 216a-d absorb incident light on the respective charge accumulation regions. The photogenerated charges accumulated in the charge accumulation regions indicate the amount of light incident on the charge accumulation regions. After the integration period, a transfer signal (e.g., a positive biasing voltage) is applied, for example from the control circuitry 106 of FIG. 1 to the vertical transfer gates 220a-d of transfer transistors 218a-d, causing the transfer transistors 218a-d to turn on and to transfer the photogenerated charges from the corresponding photodiodes 216a-d to the floating diffusion 222 during the charge transfer period. The source follower transistor 250 operatively generates the image signal based on voltage outputted by the coupled floating diffusion 222. The row select transistor 226 is coupled to the source follower transistor 250 then selectively couples the image signal onto a column bit line upon receiving a row select signal during a read out period for subsequent image processing.

Figure 3A:
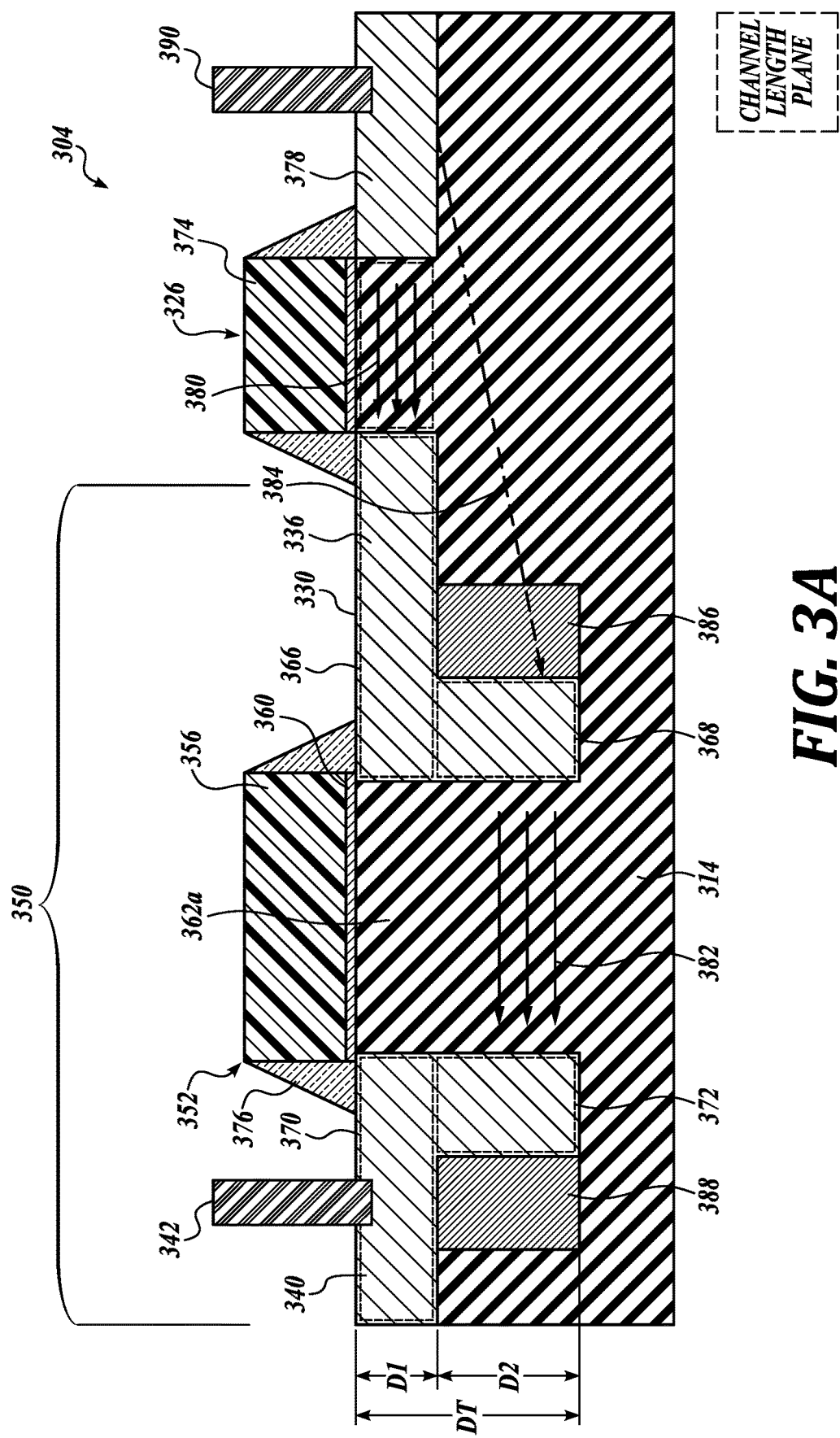
FIG. 3A shows a cross section of one embodiment of a portion of a pixel in a channel length plane in accordance with the teachings of the present disclosure.
Figure 3B:
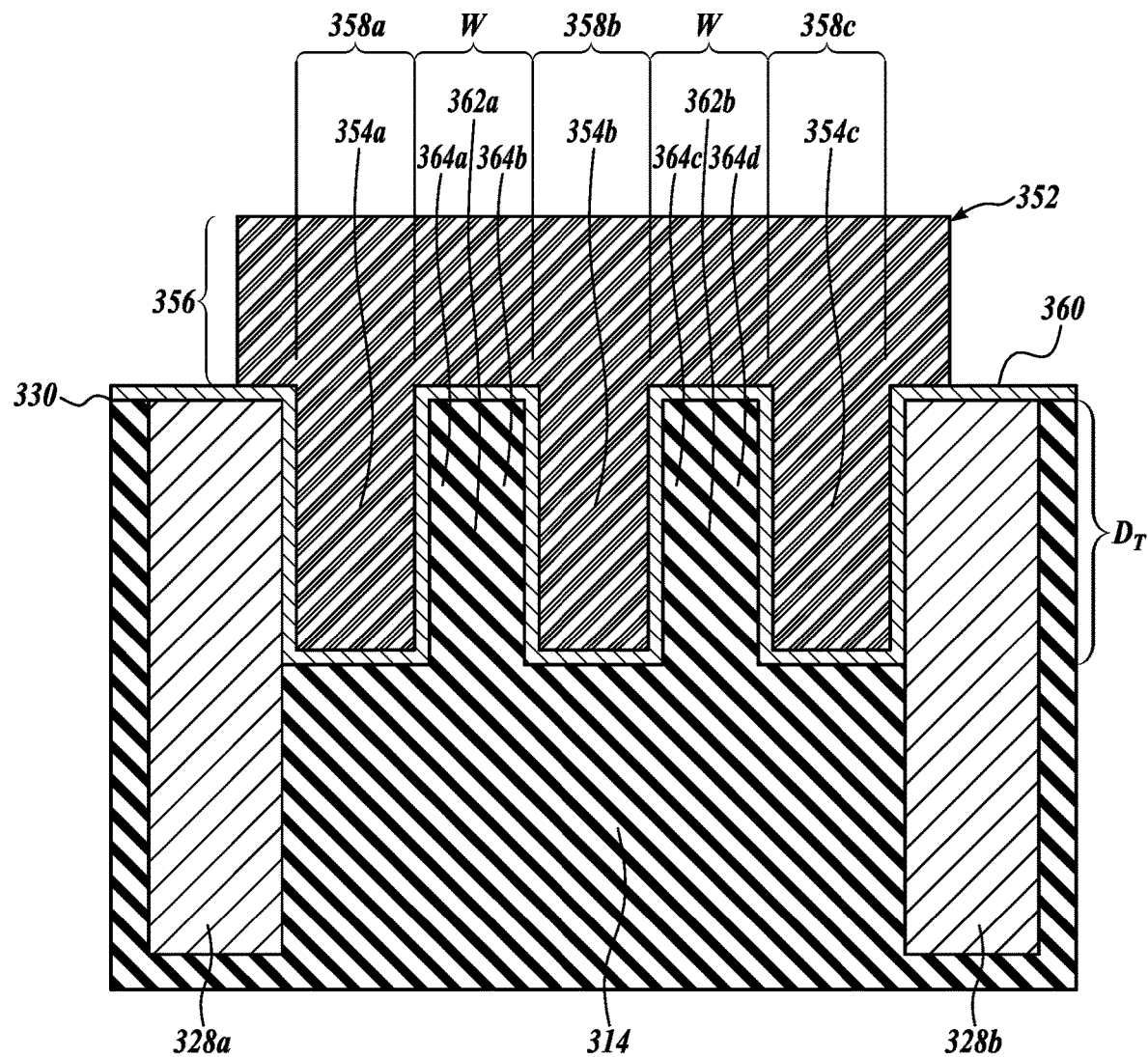
FIG. 3B shows a cross section of another portion of the pixel of FIG. 3A in a channel width plane.

FIG. 3A and FIG. 3B show different views of a portion of a pixel 304 having the same features as the pixel 204 of FIG. 2. In particular, the illustrated portion of the pixel 304 includes a source follower transistor 350 operably coupled with a row select transistor 326. A gate 352 of the source follower transistor 350 is operably coupled a floating diffusion of the pixel 304 (not shown). Notably, the use of a source follower transistor and a row select transistor in this example are representative, not limiting. For example, in any embodiment, the transistor 326 adjacent the source follower transistor 350 is a reset transistor or another transistor instead of a row select transistor. As another example, the transistor 350 may be a vertical gate-type transistor.

The viewpoint of FIG. 3A is in a channel length plane, i.e., the plane of FIG. 3A is parallel to a direction of movement of charge carriers from the row select transistor 326 to the source follower transistor 350 (e.g., movement along channels 380 and 382). By comparison, FIG. 3B shows a cross section of the source follower transistor 350 in a channel width plane which is perpendicular to the channel length plane shown in FIG. 3A.

From FIGS. 3A and 3B, it can be seen that the gate 352 is a nonplanar gate, i.e., the gate 352 has a planar gate portion 356 extending parallel to a surface 330 of the semiconductor substrate 314 and between a source 336 and a drain 340 of the source follower transistor 350 in the channel length direction, and least one fin-like or finger-like vertical gate portion 354a-c extending away from the planar gate portion 356 and into the semiconductor substrate 314. FIG. 3B in particular shows that gate 352 includes a plurality of parallel fin-like vertical gate portions 354a-c spaced apart from one another in the channel width direction, thus creating a square wave-shaped contour, which increases an effective channel width of the source follower transistor 350. Notably, the number and shape of fin-like vertical gate portions shown in FIG. 3B is representative, not limiting.

FIG. 3B also highlights channel isolation structures 328a, b disposed in the semiconductor substrate 314 on opposite sides of the source follower transistor 350 in the channel width direction. Each channel isolation structure 328a, b may extend in the channel length direction and isolates the transistor region from the active region of the pixel 304. See isolation structures 228a, b of FIG. 2. In any embodiment, the channel isolation structures 328a, b are filled with an oxide material and/or are shallow isolation trench structures having a having a depth of about 150 nm to about 400 nm with respect to surface 330 of the semiconductor substrate 314. As shown in FIG. 3B, in any embodiment, the planar gate portion 356 of gate 352 may extend at least partially over the channel isolation structures 328a, b. In any embodiment, a portion of outer vertical gate portions 354a, c may extend over the corresponding channel isolation structures 328a, b.

To enable vertical gate portions 354a-c to extend into the semiconductor substrate 314, at least one gate trench 358 is first formed therein along channel width direction, e.g., by an etching process such as dry or wet etching process or a combination of wet and dry. See FIG. 3B (showing gate trenches 358a-c). In particular, the gate trenches 358a-c are each formed as a recess extending into the semiconductor substrate 314 by a gate trench depth DT with respect to front surface 330. In any embodiment, the gate trench depth DT is about 50 nm to about 600 nm, about 100 nm to about 150 nm, about 100 nm to about 140 nm, about 100 nm to about 130 nm, about 100 nm to about 120 nm, about 100 nm to about 110 nm, about 110 nm to about 150 nm, about 120 nm to about 150 nm, about 130 nm to about 150 nm, or about 140 nm to about 150 nm. In some embodiments, the gate trench depth DT is greater than the depth of each vertical transfer gate in the corresponding active pixel area (e.g., deeper than vertical transfer gates 220a-d of transfer transistors 218a-d). In embodiments wherein the gate 352 has a plurality of vertical gate portions (e.g., 354a-354c), the gate trench 358 defines an equal number of parallel recesses (e.g., gate trenches 358a-c) across channel width plane, each of the parallel recesses (e.g., gate trenches 358a-c) extending in the channel length direction. Further still, and referring to FIG. 3B, said parallel recesses of the gate trenches 358a-c define nonplanar substrate structures 362a, b in the semiconductor substrate 314, each having a plurality of side wall portions and each of which nonplanar substrate structures 362a, b may have a width W in the channel width direction of about 5 nm to about 20 nm. For example, nonplanar substrate structure 362a has sidewall portions 364a, b, and nonplanar substrate structure 362b has sidewall portions 364c, d.

Referring to FIG. 3B, subsequent to formation of the gate trench 358, an isolation layer 360 (i.e., a gate isolation layer) is deposited in the gate trench, such that the isolation layer 360 has a layer thickness of about 5 nm to about 10 nm. The isolation layer 360 comprises a dielectric material, such as an oxide or high-k material, e.g., a material having a dielectric constant that is greater than about 3.9 (e.g., $Al_2O_3$ or $HfO_2$). In any embodiment, the dielectric material may be deposited into the gate trenches 358 to a layer thickness of about 50 nm to about 75 nm, such as to prevent formation of a channel at a bottom portion of the gate trenches 358.

Following deposition of the isolation layer 360, a gate material such as a polysilicon or metal is deposited upon the isolation layer 360, thereby forming the gate 352. An optional spacer 376 is formed around the gate 352, e.g., in a configuration that improves current and voltage parameters of the source follower transistor 350. In some embodiments, the spacer 376 surrounds the gate 352. In some embodiments, spacer 376 is formed of a dielectric material similar to the isolation layer 360. In some embodiments, spacer 376 is a single layer or multi-layer stack structure formed of oxide, nitride or a combination thereof.

The following paragraph introduces some context prior to continuing description of the inventive pixels and transistors. Transistors generally include a source and a drain of charge carriers disposed on opposite sides of the gate in the channel length direction. Such sources and drains may be formed from doped portions of the underlying semiconductor substrate. Heretofore, such source and drain doped region had a substantially uniform junction depth. As one example, the source and drain may each extend nominally into the underlying semiconductor substrate. One drawback of this configuration is that in transistors having nonplanar gates (i.e., with fin-like vertical gate portions) extending to a deeper depth in the semiconductor substrate relative to the source and drain, the charge carrier channel is not effectively formed around the nonplanar fin-like vertical gate portions—particularly around a bottom-most or most-distal region of the vertical gate portions. As another example, the source and drain may each have a uniform junction depth extending to about a same depth of the nonplanar fin-like junction portions. However, this configuration results in undesirable current leakage between adjacent transistors (e.g., between the source follower transistor and the row select transistor). For these reasons, the foregoing transistor structures do not provide satisfactory performance.

Returning to the inventive pixel 304 of FIG. 3A, the source follower transistor 350 has a dual-depth source 336 and a dual-depth drain 340 formed on opposite sides of the gate 352 in the channel length direction. The source 336 may also serve as a drain of the row select transistor 326, but is referred to herein as a source for consistency. As explained below, the dual-depth source and drain junctions promote complete charge carrier channel formation while preventing current leakage between adjacent transistors (e.g., between the source follower transistor 350 and the row select transistor 326). The drain 340 is coupled to a power line via contact 342 to receive supply voltage $V_{DD}$.

Source 336 and drain 340 are respectively formed in the semiconductor substrate 314 as doped regions at a first end and a second end of the gate trench 358 (or the gate 352) in the channel length direction. In particular, each of the source 336 and drain 340 are doped with a common first dopant (e.g., As) having a first conductive type (e.g., N-type) which is opposite to the underlying semiconductor substrate 314 having a second conductive type. In some embodiments, the source 336 and drain 340 may be formed in a well region having the second conductive type implanted in the semiconductor substrate 314. The well region having the source 336 and drain 340 may have a higher concentration than that of the semiconductor substrate 314. In some embodiments, each of the source 336 and drain 340 are implanted with alignment to the gate 352 (e.g., implanted with alignment to edge of the gate).

Each of the source 336 and the drain 340 comprises a first doped region or shallow doped region (having a shallow junction depth) and a second doped region or deep doped region extending away from the first doped region (having a deeper junction depth than the first region) with respect to front surface 330. To be more specific, the source 336 comprises a first doped region 366 having the shallow junction depth and a second doped region 368 having a deep junction depth extending away from the first doped region 366. Likewise, drain 340 comprises a first doped region 370 having a shallow junction depth and a second doped region 372 having a deep junction depth. For brevity, the first doped region and second doped region are hereinafter referred to as the first region and second region, respectively.

The terms "shallow" and "deep" as used in this context are relative terms that convey the second region extends to a deeper depth in the semiconductor substrate 314 than the first region (relative to the surface 330). Accordingly, the second region (also referred to as a deep doped region) has a deeper junction depth than the first region (also referred to as a shallow doped region). Given the similarities between the source 336 and drain 340, the first doped regions and the second doped regions shall both be described without distinguishing between the source 336 and the drain 340 unless pertinent differences warrant description.

The first regions 366, 370 and second regions 368, 372 have alike material properties and may therefore be indistinguishable from each other in a material sense. That is, the first regions and second regions are all portions of the semiconductor substrate 314 which are doped with the first dopant (e.g., As) having the first conductive type (e.g., N-type).

The shallow doped regions 366, 370 originate at or adjacent to opposite ends of the gate 352 and extend away therefrom in the channel length direction. Each shallow doped region 366, 370 has a uniform first depth D1 relative to the surface 330 of the semiconductor substrate 314 of about 50 nm to about 200 nm, about 50 nm to about 150 nm, about 50 nm to about 100 nm, about 50 nm to about 90 nm, about 50 nm to about 80 nm, about 50 nm to about 70 nm, about 50 nm to about 60 nm, about 100 nm to about 200 nm, about 150 nm to about 200 nm, about 160 nm to about 200 nm, about 170 nm to about 200 nm, about 180 nm to about 200 nm, about 190 nm to about 200 nm, or about 100 nm to about 150 nm. Generally, the shallow doped regions 366, 370 do not extend into the semiconductor substrate 314 to the gate trench depth DT. It may be stated in any embodiment, that each shallow doped region 366, 370 extends only to the first depth D1, or does not extend deeper than the first depth D1.

The source 336 (which also serves as a drain of row select transistor 326) extends in the channel length direction from the gate 352 of the source follower transistor 350 toward the planar gate 374 of the row select transistor 326. In some embodiments, the shallow doped region 366 of the source 336 extends from underneath the planar gate portion 356 of the gate 352 to underneath the planar gate 374 of the row select transistor 326. A first channel 380 of the row select transistor 326 can be formed in semiconductor substrate 314 beneath the planar gate 374 of the row select transistor 326 between the shallow doped region 366 and a source 378 of the row select transistor 326, for example when the row select transistor 326 turns on. As described above, the source 378 of the row select transistor 326 is coupled to power line (e.g., the same power line as the contact 342 coupled with the drain 340 of the source follower transistor 350) to receive the supply voltage $V_{DD}$ via contact 390.

Returning attention to the source follower transistor 350, the deep doped regions promote charge carrier movement around the full depth of the vertical gate portions of the gate 352 (e.g., each of vertical gate portions 354a-c shown in FIG. 3B). A characteristic feature of the deep doped regions 368, 372 is that each extends further to a second depth D2 in the semiconductor substrate 314 deeper than the corresponding the first depth D1 of each shallow doped region 366, 368 (relative to the surface 330 of the semiconductor substrate 314). In particular, each deep region 368, 372 extends away from a lower extent of the corresponding shallow doped region 366, 370 to the second depth D2. In any embodiment, the sum of the first depth D1 and the second depth D2 may be about equal to the gate trench depth DT, i.e., the same or greater depth as the vertical gate portions 354a-c of the gate 352. Thus, the deep doped regions 368, 372 may each extend further to second depth D2 of about 50 nm to about 500 nm, about 50 nm to about 400 nm, about 50 nm to about 300 nm, about 50 nm to about 200 nm, about 50 nm to about 100 nm, about 100 nm to about 500 nm, about 200 nm to about 500 nm, about 300 nm to about 500 nm, about 400 nm to about 500 nm. That is, the junction depth of each deep doped region 368, 372 relative to the surface 330 of the semiconductor substrate 314 in embodiments is a sum of first depth D1 and second depth D2.

As shown, for each of the source 336 and the drain 340, the shallow doped region may extend away from the corresponding deep doped region in the channel length direction, for example in a perpendicular orientation i.e., a direction perpendicular relative to a substrate depth direction or to a surface 330 of the semiconductor substrate 314. Accordingly, in any embodiment, each dual-depth source 336 and drain 340 may have an angled shaped profile, which angled shaped profile may include an L-shape (in particular, a sideways L-shape wherein the deep doped region extends away from the shallow doped region in a perpendicular orientation). In some embodiments, the source 336 and drain 340 may have a shape or profile in the channel width dimension that conforms to the shape or profile of the gate 352. For example, if the vertical gate portions 354a-c have different depths (e.g., if the center vertical gate portion 354b has a deeper gate depth), then the source 336 and drain 340 have different junction depths in the channel width direction according to the depth of the gate 352.

Advantageously, the foregoing dual-depth sources and drains promote charge carrier movement around the full depth of the vertical gate portions (e.g., through second channel 382), while preventing formation of a charge carrier path 384 from the deep doped region 368 of source 336 of the source follower transistor 350 to the source 378 of row select transistor 326 (which would otherwise cause current leakage). In particular, the deep doped regions 368, 372 extend vertically along the vertical gate portions 354a-c and provide free charge carriers by virtue of the first dopant, which enables formation of channels (e.g., second channel 382) in the channel length direction along the sidewall portions 364a-d of the nonplanar substrate structures 362a-b when the source follower transistor 350 turns on, increase the effective channel width of the source follower transistor 350, thereby increasing Gm of the source follower transistor 350 to improve device performance. At the same time, the distance between the deep doped region 368 of source 336 of the source follower transistor 350 and the source 378 of the row select transistor 326 is relatively large, thereby inhibiting junction leakage between the two adjacent transistors 350, 326.

Still referring to FIG. 3A, pixel 304 includes optional isolation regions formed as doped regions implanted in the semiconductor substrate 314 adjacent the shallow doped regions and deep doped regions. These isolation regions further prevent current leakage from the shallow and deep doped regions by forming a barrier layer along an outer extent of the dual depth source/drain, which interfaces with the isolation regions. In particular, source follower transistor 350 includes a source isolation region 386 and a drain isolation region 388, which are each formed in a region of the semiconductor substrate 314 partially delimited by the respective shallow doped regions and deep doped regions, i.e., the interior region delimited on one side by the deep doped region 368 or deep doped region 372 and on an upper side by the corresponding shallow region 366 or 370. To create the barrier layer, each of the source isolation regions 386, 388 are doped with a second dopant (e.g., Boron) having a second conductive type, opposite to the first conductive type of the source 336 and drain 340. In any embodiment, the source isolation region 386, drain isolation region 388, and/or other isolation regions such as the channel isolation region of FIG. 5 may have a dopant concentration greater than a dopant concentration of the surrounding semiconductor substrate 314. As a representative example, the region of the semiconductor substrate 314 shown in FIG. 3A may be including a P-type doped well region having a dopant concentration of about $E16/cm^3$, and the source isolation region 386 and drain isolation region 388 may each have a P-type dopant concentration of greater than about $E16/cm^3$, e.g., about $E17/cm^3$ to about $E18/cm^3$.

In any embodiment, each of the source isolation region 386 and the drain isolation region 388 extend into the semiconductor substrate 314 from a lower extent of the corresponding shallow doped region 366, 370 to a lower extent of the corresponding deep doped region 368, 372, and/or extend at least as deep as the gate trench depth DT. Restated, each of the source isolation region 386 and the drain isolation region 388 may extend from the first depth D1 to at least the second depth D2. In some embodiments such as described below with respect to FIG. 4, each of the source isolation region 386 and the drain isolation region 388 each extend deeper than the gate trench depth DT or second depth D2, for the benefit of enhancing channel isolation.

Additional variations of isolation regions are described below with respect to FIG. 4 and FIG. 5.

Figure 4:
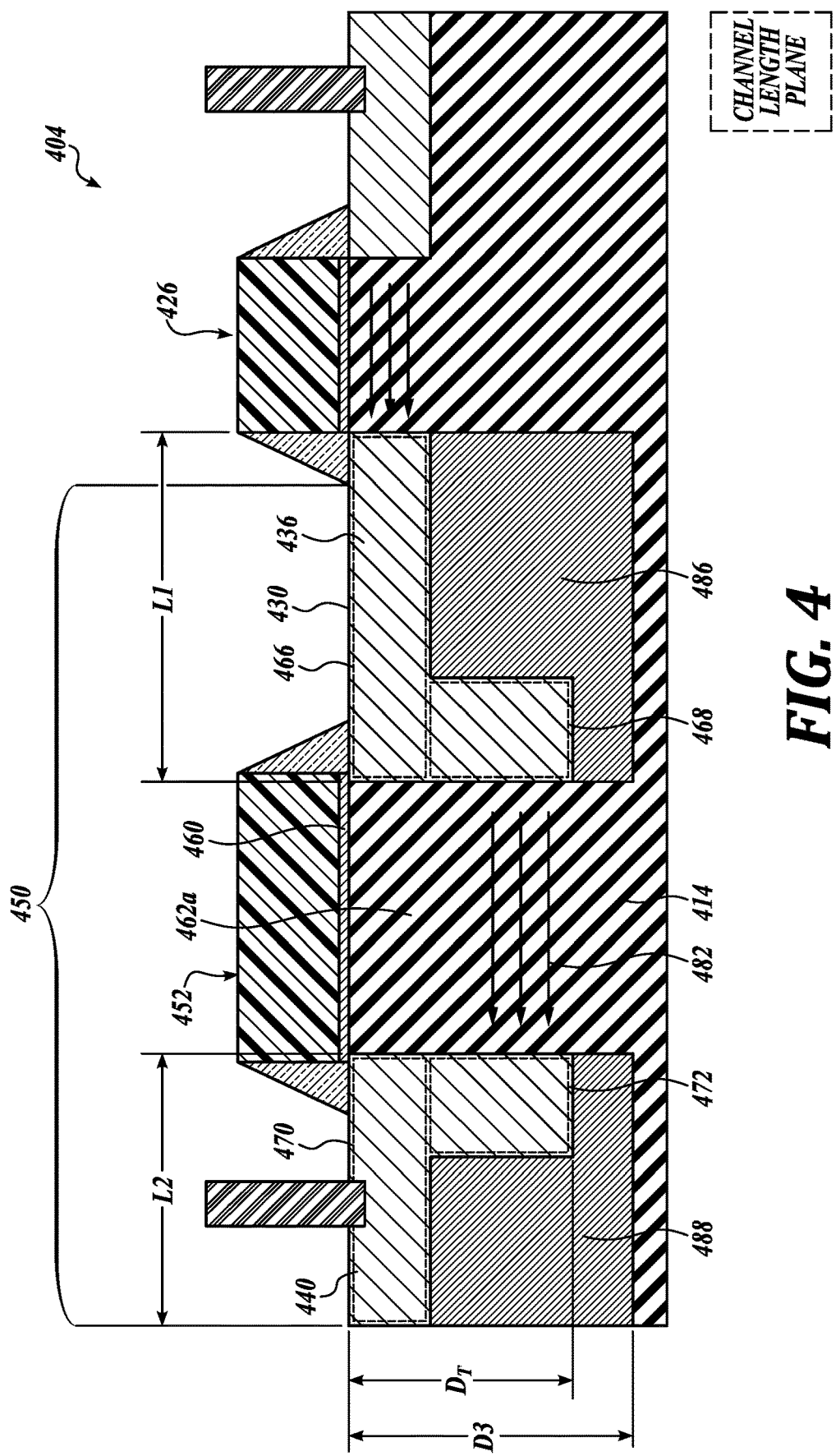
FIG. 4 shows a cross section of one embodiment of a portion of another pixel in a channel length plane in accordance with the teachings of the present disclosure.

FIG. 4 shows a portion of a pixel 404 having the same features as the pixel 304 of FIG. 3A-FIG. 3B, except where described below. Accordingly, alike reference numerals have alike meanings as described above (e.g., 460 corresponds to an isolation layer as defined above with respect to isolation layer 360), and only relevant differences are described herein.

While the dual-depth deep source and drain of the pixel 404 are the same as the pixel 304, the formation of the source isolation region 486 and drain isolation region 488 are each larger in order to more effectively isolate the channel 482 and to prevent current leakage between the source follower transistor 450 and the row select transistor 426. In particular, each of the source isolation region 486 and drain isolation region 488 extend from a lower extent of the corresponding shallow doped region 466, 470 into the semiconductor substrate 414 to a third depth D3 which is deeper than the gate trench depth DT or the depth of the deep doped regions 468, 472 with respect to front surface 430 of semiconductor substrate 414. In any embodiment, the third depth D3 is about 50 nm to about 300 nm deeper than the gate trench depth DT or the depth of the deep doped regions 468, 472 with respect to the front surface 430 of the semiconductor substrate 414. Accordingly, in any embodiment, the source isolation regions 486, 488 may be about 50 nm to about 300 nm deeper than any of the depths DT or second depth D2 identified above with respect to FIG. 2. Additionally or alternatively, each of the source isolation region 486 and drain isolation region 488 extend at least to a full length $L_1$, $L_2$ of the corresponding shallow doped region 466, 470 in the channel length direction. Accordingly, in such embodiments, the source isolation region 486 and the drain isolation region 488 each extend under a lower extent of the corresponding shallow doped regions 466, 470 and deep doped regions 468, 472. In embodiments, each of the source isolation region 486 and drain isolation region 488 is immediately adjacent or abuts the corresponding shallow doped regions 466, 470 and deep doped regions 468.

In any embodiment, one of the isolation regions 486, 488 may have the configuration shown in FIG. 4, while another of the isolation regions may have the configuration shown in FIG. 3A.

Figure 5:
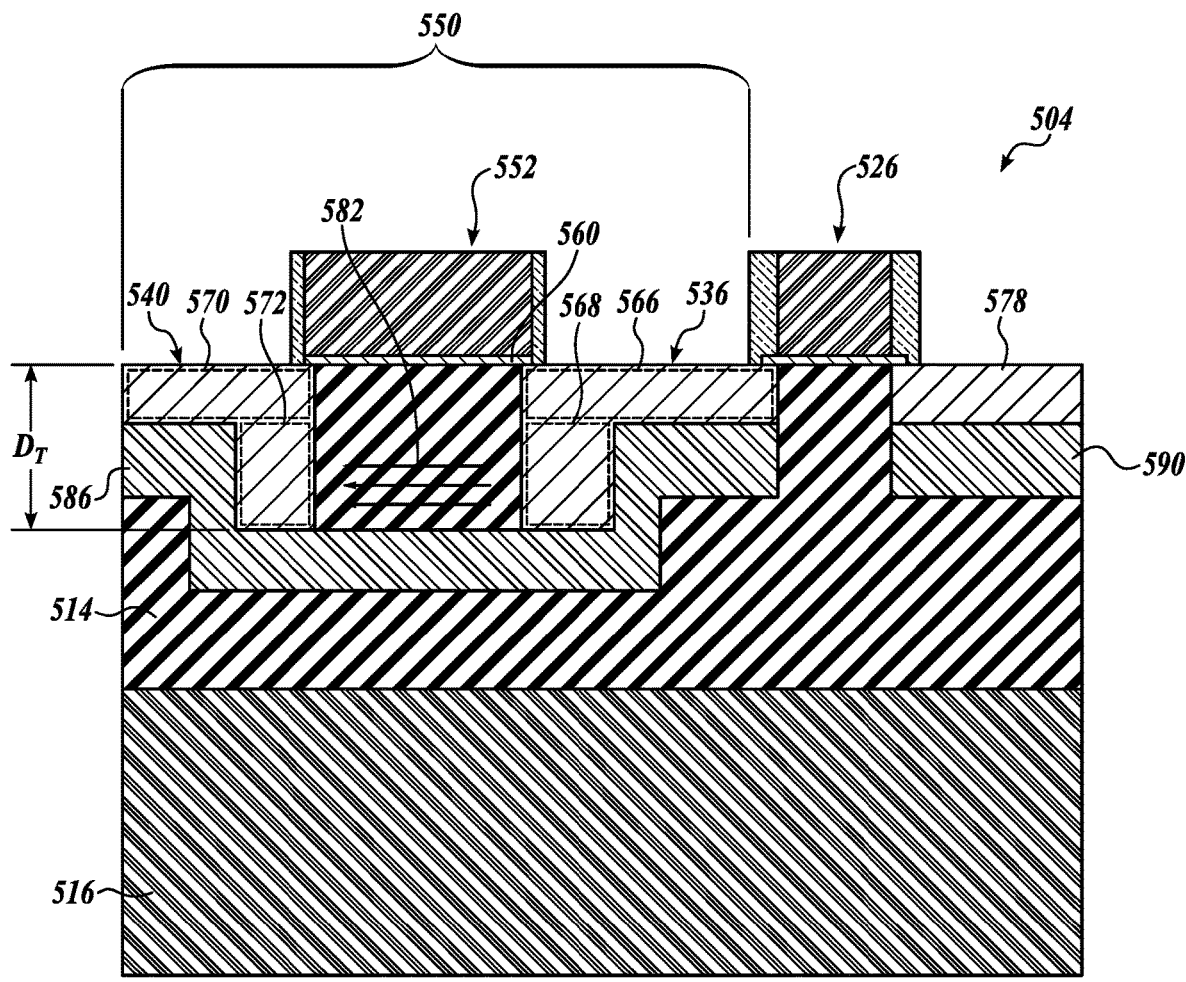
FIG. 5 shows a cross section of one embodiment of a portion of another pixel in a channel length plane in accordance with the teachings of the present disclosure.

FIG. 5 shows a portion of yet another pixel 504 having the same features as the pixel 304 of FIG. 3A-FIG. 3B and pixel 404 of FIG. 4 except where described below. Accordingly, alike reference numerals have alike meanings as described above (e.g., 560 corresponds to an isolation layer as defined above with respect to isolation layer 360), and only relevant differences are described herein. The embodiment of FIG. 5 may be advantageous in pixels where at least a portion of at least one photodiode is disposed directly beneath the transistor region of the pixel.

While the dual-depth source 536 and drain 540 of the pixel 504 are the same as the previously described pixels, the channel 582 is isolated from the photodiode 516 by a single channel isolation region 586 extending continuously beneath the source 536, the gate 552 of source follower transistor 550, and the drain 540. The gate 552, similar to gate 352 of the source follower transistor 350, includes a planar gate and at least a vertical gate. In particular, the channel isolation region 586 is disposed between the photodiode 516 and source 536 and drain 540, and extends in the channel length direction from a distal extent of the shallow doped region 570 (of the drain 540) to an opposite distal extent of the shallow doped region 566 (of the source 536). At least a central portion of the channel isolation region 586 disposed under the gate 552 extends to a deeper depth in the semiconductor substrate 514 than a gate depth of the vertical gate portion of the gate 552, e.g., about 50 nm to about 300 nm deeper than the gate 552 or the gate trench depth DT. Like the isolation regions of FIG. 3A-FIG. 4, the channel isolation region 586 is formed as a doped region with the second dopant in the semiconductor substrate 514 and has the second conductive type, opposite the first conductive type of the source 436 and drain 440. The channel isolation region 586 may have a concentration higher than the concentration of the semiconductor substrate 514.

Similar to the isolation regions of FIG. 3A-FIG. 4, an optional channel isolation region 590 is formed as a doped region below the source 578 of the row select transistor 526, and may have any of the same material properties as the channel isolation region 586. The channel isolation region 590 is a feature which may be utilized in any embodiment described herein, e.g., for the benefit of isolating the row select transistor 526 from the photodiode 516.

Figure 6A:
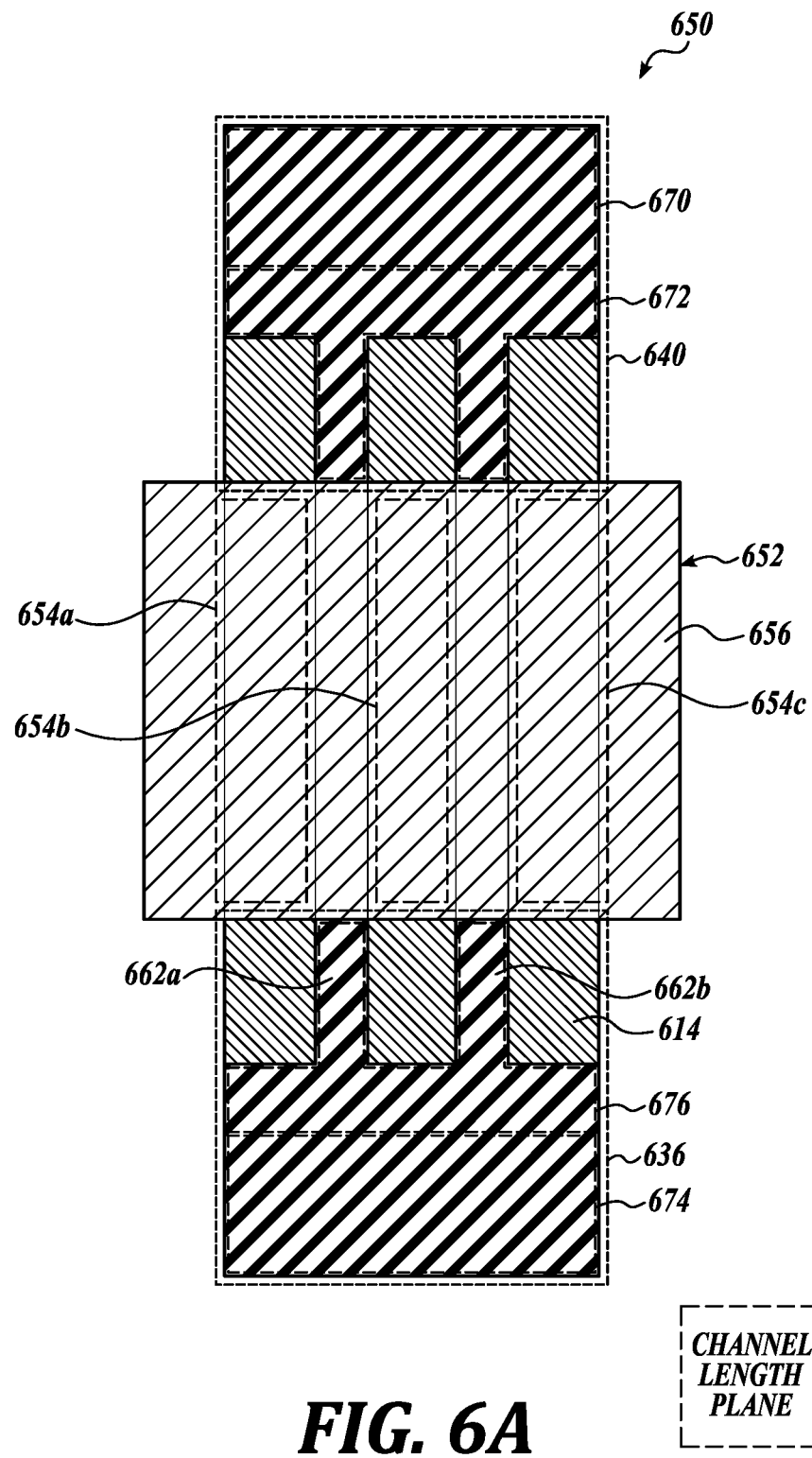
FIG. 6A shows a schematic top view of a portion of another transistor in accordance with the teachings of the present disclosure.
Figure 6B:
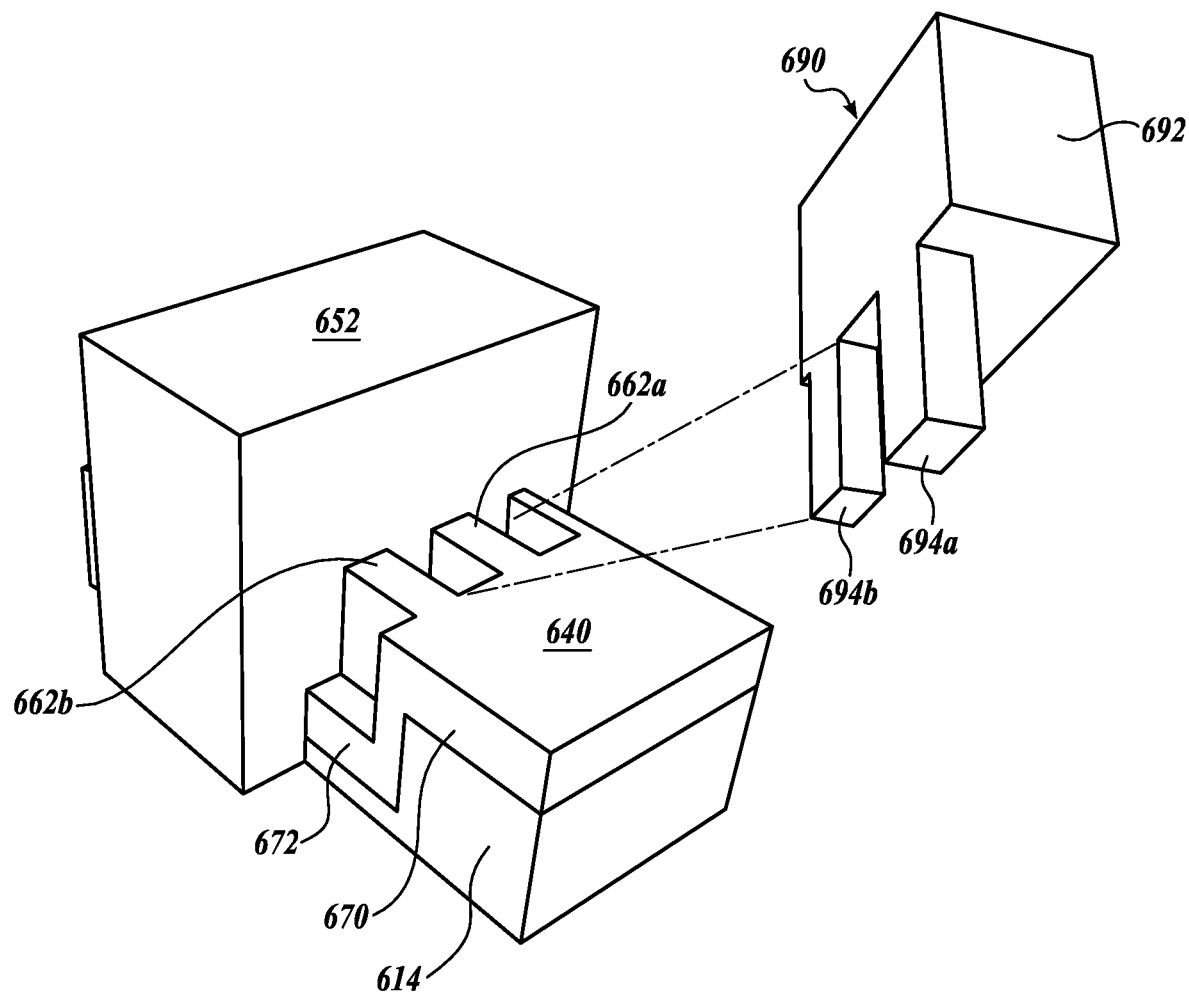
FIG. 6B shows a schematic perspective view of the portion of the transistor of FIG. 6A.

FIG. 6A shows a schematic top view of a portion of a transistor 650 having a nonplanar source and drain. FIG. 6B shows a schematic perspective view of the transistor 650 with an optional drain contact, which will be described below. The transistor 650 has the same features as the previously-described transistors 350, 450, and 550 except for the pertinent differences detailed below. It shall be appreciated that the transistor 650 is not limited to source follower transistors and may be any transistor having vertical gate electrode.

Like the previously described transistors, the transistor 650 includes a dual-depth source 636 and a dual-depth drain 640 (see shallow doped regions 670, 674 and deep doped regions 672, 676). A plurality of gate trenches is formed in a semiconductor substrate 614 defining a plurality of nonplanar substrate structures 662a, b. The plurality of gate trenches are interposed between and adjacent the nonplanar substrate structures 662a, b. This configuration is similar to that shown in FIG. 3B (the number of nonplanar substrate structures shown is representative, not limiting). Accordingly, a gate 652 is disposed over the nonplanar substrate structures 662a, b and includes a planar gate portion 656 disposed upon a top surface of the semiconductor substrate 614, from which a plurality of vertical gate portions 654a-c each extend into one of the gate trenches.

Unlike the previously-described transistors, the transistor 650 has the unique feature that the source 636 and drain 640 each include a portion of each of the nonplanar substrate structures 662a, b. Restated, a portion of each end of each nonplanar substrate structure 662a, b is doped with a dopant having the first conductive type which is opposite to that of the underlying semiconductor substrate 614, such as through a surface plasma implant process, a low energy tilt implant process, or similar. Because the source 636 and drain 640 can be formed at both the shallower depth and the deeper depth of the dual-depth structure with a surface plasma implant process or similar process, the fabrication process avoids the need for a two-step implantation process. Thus, as shown best in FIG. 3B, the nonplanar substrate structures 662a, b form part of both deep doped regions (see, deep doped region 672). Thus, the source 636 and drain 640 benefit from the dual-depth structure described above, in addition to improved channel performance by virtue of the nonplanar substrate structures 662a, b which are integrally formed therein.

As shown in FIG. 6B, an optional drain contact 690 is operably connected to a current source. Drain contact 690 is formed from a metal or other electrically conductive material, and includes a body portion 692 from which a plurality of finger portions 694*a, b* extend. Each finger portion 694*a, b* extends into a corresponding one of the gate trenches adjacent to the drain 640 formed in the semiconductor substrate 614. Accordingly, in any embodiment, the number of vertical gate portions may equate to a number of gate trenches. In any embodiment, the transistor 650 may additionally or alternatively include a source contact having a structure identical to the drain contact 690, but with finger portions which extend into the gate trenches and couple to source 636.

Figure 7:
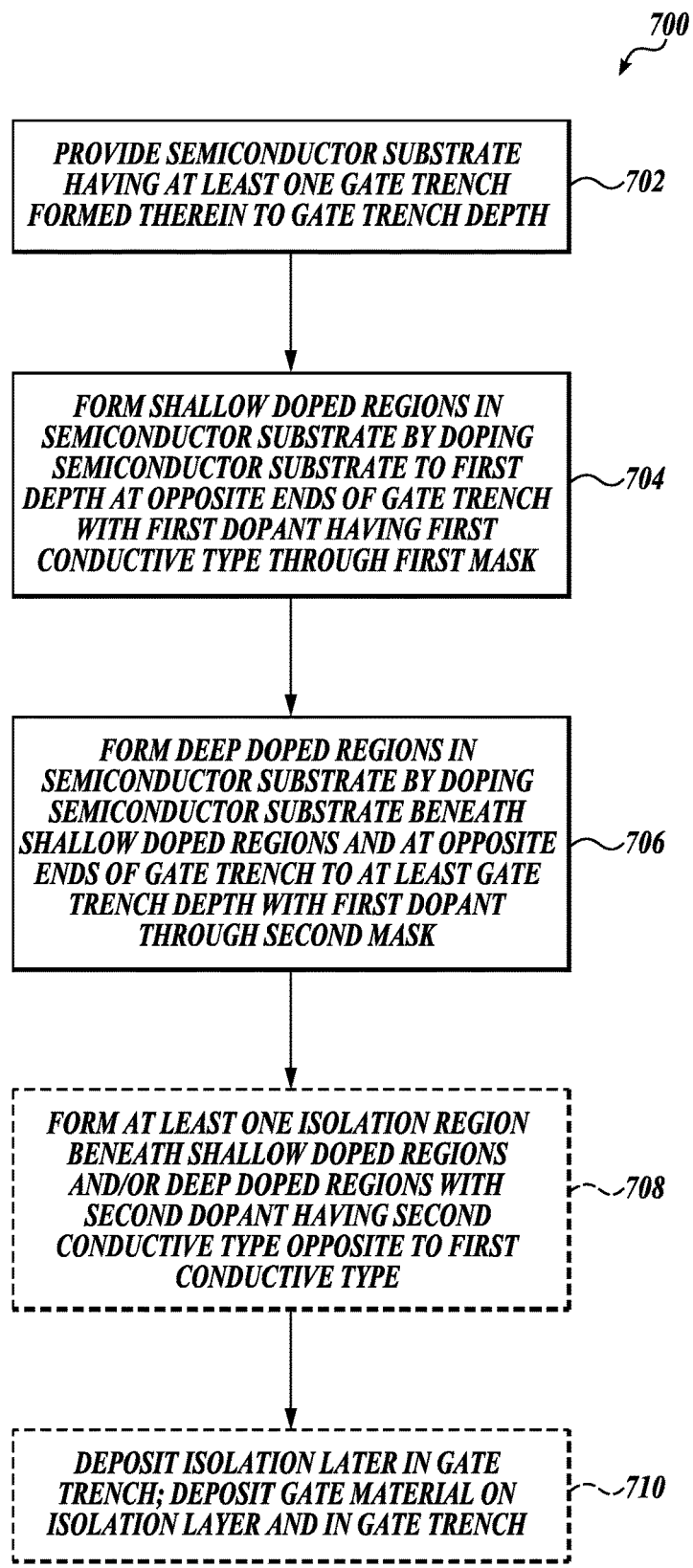
FIG. 7 shows methods of forming transistors in accordance with the present disclosure.

FIG. 7 shows methods 700 of forming transistors of the present disclosure. The terms used below have alike meanings with alike terms used above to describe the inventive structures. In any embodiment of the methods 700, the steps may be performed in the order introduced below.

In step 702, a semiconductor substrate having at least one gate trench formed therein is provided. The at least one gate trench is formed, such as by etching the semiconductor substrate with dry etch, wet etch or a combination thereof, to a gate trench depth of about 50 nm to about 600 nm about 50 nm to about 500n, about 50 nm to about 400 nm, about 50 nm to about 300 nm, about 50 nm to about 200 nm, about 50 nm to about 100 nm, about 100 nm to about 600 nm, about 200 nm to about 600 nm, about 300 nm to about 600 nm, about 400 nm to about 600 nm, or about 500 nm to about 600 nm. In any embodiment, the at least one gate trench includes a plurality of parallel gate trenches which define one or more nonplanar substrate structures in the semiconductor substrate.

In step 704, shallow doped regions (first doped regions) of a source and a drain are formed in the semiconductor substrate by doping a region in the semiconductor substrate to a first depth at opposite ends of the at least one gate trench with a first dopant (e.g., As) having a first conductive type (opposite to the semiconductor substrate) through a first mask. In any embodiment, the first depth is about 50 nm to about 200 nm, about 10 nm to about 40 nm, about 10 nm to about 30 nm, about 10 nm to about 20 nm, about 20 nm to about 50 nm, about 30 nm to about 50 nm, or about 40 nm to about 50 nm. In any embodiment, an ion implantation, plasma implantation process, tilt implant process through at least one gate trench, or similar process may be utilized. In any embodiment, forming the shallow doped regions may include doping a portion of at least one nonplanar substrate structure of the semiconductor substrate with the first dopant to at least the first depth.

In step 706, deep doped regions (second doped regions) for the source and drain are formed in the semiconductor substrate by doping regions of the semiconductor substrate beneath the shallow doped regions and at opposite ends of the gate trench to at least the gate trench depth with the first dopant through a second mask. In embodiment with ion implantation, the same process may be utilized as in step 704, e.g., with a higher implantation energy. For example, shallow doped regions of the source and the drain are formed by implanting first dopant into the semiconductor substrate with a first implant energy, and deep doped regions for the source and drain are formed by implanting first dopant into the semiconductor substrate with a second implant energy greater than the first implant energy such that each of the deep doped regions extends from the respective shallow doped region and having a junction depth formed at a deeper depth than the respective shallow doped region. In any embodiment, an ion implantation, plasma implantation process, tilt implant process through at least one gate trench, or similar process may be utilized to form the deep region; in such embodiments, this step may be performed substantially simultaneously with the formation of the shall regions in step 704. In any embodiment, forming the deep doped regions may include doping a portion of at least one nonplanar substrate structure of the semiconductor substrate with the first dopant to at least the gate trench depth, e.g., using a plasma implant or tilt implant process through gate trenches.

In optional step 708, at least one isolation region is formed beneath the shallow regions and/or the deep doped regions by masking and implanting the semiconductor substrate with a second dopant (e.g., Boron) having a second conductive type opposite to first conductive type. In any embodiment, the at least one isolation region is formed through a third mask. In any embodiment, the at least one isolation region extends from a lower extent of the shallow junction to at least the gate trench depth. In any embodiment, the at least one isolation structure extends to a deeper depth than the gate trench depth, e.g., about 50 nm to about 300 nm deeper than the gate trench depth. In any embodiment, the isolation region has a dopant concentration greater than a dopant concentration of the semiconductor substrate. In some embodiments, the isolation region extends continuously in the channel length direction from a distal extent of the shallow doped region of the drain, underneath the at least one gate trench and/or gate, to an opposite distal extent of the shallow doped region of the drain as illustrated in FIG. 5. In any embodiment, the isolation region extends at least to a full length $L_1$, $L_2$ of the corresponding shallow doped region in the channel length direction.

In step 710, an isolation layer of a dielectric material is deposited in the gate trench and a gate material comprising a metal, polysilicon, or similar material is deposited on the isolation layer and in gate trench. In any embodiment, the isolation layer may be deposited to a layer thickness of about 3 nm to about 10 nm.

Advantageously, the transistors, pixels, and devices described herein having dual-depth sources and drains promote charge carrier movement around the full depth of the nonplanar gate, thus increasing Gm, while simultaneously preventing current leakage between adjacent transistors.

What is claimed is:

1. A transistor formed in a semiconductor substrate, comprising:
   a gate trench formed in the semiconductor substrate and extending to a gate trench depth;
   a source and a drain formed as doped regions in the semiconductor substrate and having a first conductive type, wherein the source and the drain are formed along a channel length direction of the transistor at a first end and a second end of the gate trench, respectively, wherein the source and the drain each comprises a first doped region and a second doped region extending away from the first doped region, wherein the second doped region extends to a depth in the semiconductor substrate deeper than the first doped region relative to a surface of the semiconductor substrate;
   an isolation layer disposed in the gate trench;
   a gate disposed on the isolation layer and extending into the gate trench; and
   a source isolation region and a drain isolation region formed as doped regions in the semiconductor substrate adjacent to the first doped region and the second doped region of the source and the drain, respectively, wherein the source isolation region and the drain isolation region have a second conductive type, opposite to the first conductive type.

2. The transistor of claim 1, wherein the first doped region forms a shallow junction having a uniform first junction depth in the semiconductor substrate, and wherein the second doped region forms a deep junction having a second junction depth in the semiconductor substrate, wherein the second junction depth is greater than the first junction depth with respect to the surface of the semiconductor substrate.

3. The transistor of claim 1, wherein the gate trench includes a plurality of gate trenches which defines, in the semiconductor substrate, at least one nonplanar substrate structure having a plurality of side wall portions in a channel width plane perpendicular to the channel length direction of the transistor.

4. The transistor of claim 3, wherein the source and the drain are formed at a first end and an opposite second end of the at least one nonplanar substrate structure along the channel length direction.

5. The transistor of claim 1, wherein for each of the source and the drain, the second doped region extends into the semiconductor substrate at least to the gate trench depth.

6. The transistor of claim 1, wherein for each of the source and the drain, the first doped region does not extend into the semiconductor substrate to the gate trench depth.

7. The transistor of claim 3, wherein the source and the drain are partially formed in the at least one nonplanar substrate structure, and wherein the gate couples to the source to the drain.

8. The transistor of claim 7, wherein the at least one nonplanar substrate structure forms part of the second doped region of each of the source and the drain.

9. The transistor of claim 1, wherein each of the source and the drain have an angled shape.

10. The transistor of claim 9, wherein for each of the source and the drain, the first doped region extends along the channel length direction away from the second doped region in a perpendicular orientation.

11. The transistor of claim 1, wherein the source isolation region and the drain isolation region each extend into the semiconductor substrate from a lower extent of the first doped region to a lower extent of the second doped region.

12. The transistor of claim 1, wherein the source isolation region and the drain isolation region each extend into the semiconductor substrate to at least the gate trench depth.

13. The transistor of claim 1, wherein the source isolation region and the drain isolation region extend into the semiconductor substrate deeper than the gate trench depth.

14. The transistor of claim 1, wherein each of the source isolation region and the drain isolation region have a dopant concentration greater than a dopant concentration of the semiconductor substrate.

15. The transistor of claim 1, further comprising a channel isolation region formed as a doped region in the semiconductor substrate and having the second conductive type, opposite the first conductive type, wherein the channel isolation region extends continuously beneath the source, the gate, and the drain.

16. An image sensor, comprising:
the transistor of claim 1;
a photodiode formed in the semiconductor substrate;
a floating diffusion coupled to the gate of the transistor;
a transfer transistor coupling the photodiode to the floating diffusion, wherein the transfer transistor is operative to transfer image charges from the photodiode to the floating diffusion, wherein the transistor is a source follower transistor.

17. The image sensor of claim 16, further comprising a second transistor having a drain includes the first doped region of the source of the source follower transistor, wherein the second transistor comprises:
a planar gate disposed on the surface of the semiconductor substrate adjacent the source of the source follower transistor; and
a source disposed in the semiconductor substrate on an opposite side of the planar gate from the drain of the second transistor in a channel length direction, wherein the source of the second transistor extends from the surface of the semiconductor substrate to a same junction depth as the first doped region of the drain of the second transistor.

18. The image sensor of claim 17, further comprising:
a source isolation region and a drain isolation region formed as doped regions in the semiconductor substrate adjacent to the first doped region and the second doped region of the source and the drain of the source follower transistor, respectively, wherein the source isolation region and the drain isolation region have the second conductive type, opposite to the first conductive type; and
a second channel isolation region formed as a doped region in the semiconductor substrate adjacent to the drain of the second transistor, wherein the second channel isolation region has the second conductive type.

19. The image sensor of claim 16, further comprising a channel isolation region formed as a doped region in the semiconductor substrate and having a second conductive type, opposite the first conductive type, wherein the channel isolation region extends beneath the source, the gate trench, and the drain of the source follower transistor,
wherein a portion of the photodiode extends underneath the source, the gate trench, and the drain of the source follower transistor,
wherein the channel isolation region is disposed between the photodiode and the gate trench.

20. A method of forming a transistor in a semiconductor substrate, comprising:
providing the semiconductor substrate having a gate trench formed therein to a gate trench depth;
forming a source and a drain of the transistor, each having a dual junction depth including a first junction depth and a second junction depth greater than the first junction depth with respect to a surface of the semiconductor substrate, wherein forming the source and the drain of the transistor further comprises:
forming a first doped region in the semiconductor substrate by doping the semiconductor substrate to the first junction depth on opposite ends of the gate trench with a first dopant having a first conductive type through a first mask using a first implantation energy;
forming a second doped region extending from the corresponding first doped region in the semiconductor substrate by doping regions of the semiconductor substrate beneath the first doped region and on opposite ends of the gate trench to at least the gate trench depth with the first dopant through a second mask using a second implantation energy greater than the first implantation energy; and
forming at least one isolation region by doping the semiconductor substrate to at least the gate trench depth beneath the first doped regions and the second doped regions with a second dopant having a second conductive type opposite to the first conductive type, wherein the gate trench depth is deeper than the first junction depth.

21. The method of claim 20, wherein forming the source and the drain of the transistor comprises doping the opposite ends of the gate trench using a plasma implant or tilt implant process.

22. The method of claim 20, further comprising:
depositing an isolation layer in the gate trench; and
depositing a gate material on the isolation layer and in gate trench.

* * * * *